(12) United States Patent
Ikedo et al.

(10) Patent No.: US 7,956,667 B2
(45) Date of Patent: Jun. 7, 2011

(54) POWER SUPPLY VOLTAGE FORMING DEVICE AND POLAR MODULATION TRANSMISSION DEVICE

(75) Inventors: Taichi Ikedo, Kanagawa (JP); Akihiko Matsuoka, Kanagawa (JP)

(73) Assignee: Panasonic Corporation, Osaka (JP)

( * ) Notice: Subject to any disclaimer, the term of this patent is extended or adjusted under 35 U.S.C. 154(b) by 70 days.

(21) Appl. No.: 12/524,671

(22) PCT Filed: Jan. 29, 2008

(86) PCT No.: PCT/JP2008/051277
§ 371 (c)(1),
(2), (4) Date: Jul. 27, 2009

(87) PCT Pub. No.: WO2008/093665
PCT Pub. Date: Aug. 7, 2008

(65) Prior Publication Data
US 2010/0066429 A1    Mar. 18, 2010

(30) Foreign Application Priority Data
Jan. 31, 2007    (JP) ................................. 2007-022000

(51) Int. Cl.
G06G 7/12        (2006.01)
H04B 1/04        (2006.01)
(52) U.S. Cl. .................... 327/362; 327/361; 375/296
(58) Field of Classification Search .......... 375/295–296, 375/300, 308; 327/361, 309, 317; 330/127, 330/199
See application file for complete search history.

(56) References Cited

U.S. PATENT DOCUMENTS

| 6,998,919 | B2 | 2/2006 | Gamero |
| 7,599,418 | B2* | 10/2009 | Ahmed ......................... 375/135 |
| 7,734,263 | B2* | 6/2010 | Maeda et al. ............... 455/127.1 |
| 7,778,352 | B2* | 8/2010 | Jensen et al. .................... 375/297 |
| 7,801,244 | B2* | 9/2010 | Hietala ......................... 375/296 |
| 2003/0198300 | A1 | 10/2003 | Matero |
| 2005/0088237 | A1 | 4/2005 | Gamero |
| 2006/0159198 | A1 | 7/2006 | Morimoto |
| 2009/0023402 | A1 | 1/2009 | Shimizu |

FOREIGN PATENT DOCUMENTS

| JP | 2006-333445 | 12/2006 |
| WO | 2005-104352 | 11/2005 |

OTHER PUBLICATIONS

Extended European Search Report, dated Jan. 8, 2010.
International Search Report dated Apr. 8, 2008.

* cited by examiner

*Primary Examiner* — Dinh T. Le
(74) *Attorney, Agent, or Firm* — Dickinson Wright PLLC

(57) ABSTRACT

Provided is a power voltage forming device which can correct an offset voltage of a high-frequency power amplifier without degrading distortion characteristic of a high-frequency power amplifier. The power voltage forming device (100) includes: a level adjusting unit (103) which adjusts the level of input data subjected to analog conversion, according to an output level control value for controlling the output level of the high-frequency power amplifier (200); an analog adder (104) which performs analog addition of the offset data subjected to the analog conversion, to the signal after the level adjustment; a digital adder (101) which performs digital addition of the offset data to the input data before the analog conversion; and a selection unit (106) which selects whether to perform addition by the analog adder (104) or addition by the digital adder (101) according to the output level control value.

7 Claims, 11 Drawing Sheets

| SETTING VALUE OF ATT (dB) | OFFSET VOLTAGE AFTER SCALING (V) | TOTAL SIGNAL RANGE AFTER DIGITAL ADDITION (Vpp) | AMPLITUDE SIGNAL RANGE AFTER PASSING ATT (Vpp) | OFFSET VOLTAGE AFTER PASSING ATT (Vpp) |
|---|---|---|---|---|
| 0 | 0.100 | 1.100 | 1.000 | 0.1 |
| -2 | 0.126 | 1.126 | 0.794 | 0.1 |
| -4 | 0.158 | 1.158 | 0.631 | 0.1 |
| -6 | 0.200 | 1.200 | 0.501 | 0.1 |
| -8 | 0.251 | 1.251 | 0.398 | 0.1 |
| -10 | 0.316 | 1.316 | 0.316 | 0.1 |
| -12 | 0.398 | 1.398 | 0.251 | 0.1 |
| -14 | 0.501 | 1.501 | 0.200 | 0.1 |
| -16 | 0.631 | 1.631 | 0.158 | 0.1 |
| -18 | 0.794 | 1.794 | 0.126 | 0.1 |
| -20 | 1.000 | 2.000 | 0.100 | 0.1 |

⇐ DIGITAL ADDITION / ⇒ ANALOG ADDITION

FIG.8

POWER SUPPLY VOLTAGE FORMING DEVICE AND POLAR MODULATION TRANSMISSION DEVICE

TECHNICAL FIELD

The present invention relates to a power supply voltage forming apparatus that forms a power supply voltage to supply to a high frequency power amplifier, according to input data, and relates to a polar modulation transmitting apparatus having such a power supply voltage forming apparatus.

BACKGROUND ART

In the design of a transmission modulation apparatus, generally, a trade-off relationship holds between efficiency and linearity. However, recently, technology to enable compatibility between efficiency and linearity has been proposed, including polar modulation transmission technology.

FIG. 1 illustrates a configuration example of a polar modulation transmitting apparatus. Polar modulation transmitting apparatus 10 is provided with amplitude/phase data forming section 11, phase modulator 12, high frequency power amplifier (also called "power amplifier") 14 and power supply voltage forming apparatus 13 that forms the power supply voltage $V_{CC}$ of high frequency power amplifier 14.

Amplitude/phase data forming section 11 forms a baseband amplitude signal S1 and baseband phase signal S2 from a transmission signal that is received as input. Here, when the in-phase component of the transmission signal is represented by "I" and the quadrature component of the transmission signal is represented by "Q," the baseband amplitude signal S1 is represented by $\sqrt{(I^2+Q^2)}$. The baseband phase signal S2 is the phase component of the transmission signal (e.g., the angle formed between the modulation symbol and the I-axis).

Phase modulator 12 forms a high frequency phase modulation signal S3 by modulating a carrier frequency signal by the baseband phase signal S2, and outputs this to the signal input terminal of high frequency power amplifier 14.

Based on the baseband amplitude signal S1, power supply voltage forming apparatus 13 forms a power supply voltage $V_{CC}$ to supply to the power supply terminal of high frequency power amplifier 14.

By this means, in high frequency power amplifier 14, the signal multiplying the power supply voltage value $V_{CC}$ and the high frequency phase modulation signal S3 is amplified by the gain in high frequency power amplifier 14, and the resulting transmission output signal is outputted. This transmission output signal is transmitted from an antenna (not shown).

With this polar modulation transmission technology, the high frequency phase modulation signal S3 that is received as input in high frequency power amplifier 14 is a constant envelope signal having no fluctuation component in the amplitude direction, so that it is possible to use an efficient non-linear amplifier as high frequency power amplifier 14.

By the way, this polar modulation transmitting apparatus 10 is required to establish a proportional relationship between the power supply voltage value $V_{CC}$ formed based on the baseband amplitude signal S1 and the output voltage of high frequency power amplifier 14 (generally calculated by converting the transmission output signal in the figure into a voltage subject to 50 Ωresistance).

Here, a HBT (Hetero-junction Bipolar Transistor) device, which allows higher gain than a FET (Field Effect Transistor) device and which can be miniaturized easily, is often used as an element that is used in high frequency power amplifier 14.

However, a HBT device has a specific parameter called "offset voltage" between the power supply voltage value and output voltage.

FIG. 2 illustrates the relationship between the power supply voltage value $V_{CC}$ and output voltage, in the case of forming high frequency power amplifier 14 using a HBT device. In this figure, the solid line represents the relationship between the power supply voltage $V_{CC}$ and output voltage in the case of using a HBT device, and, although the power supply voltage $V_{CC}$ and output voltage change linearly, the line does not pass the origin and is therefore understood not to represent a proportional relationship. The offset voltage is the power supply voltage value at the time when the output rises, and FIG. 2 shows the relationship between the power supply voltage $V_{CC}$ and output voltage with linear approximation, and defines the intersection point of this line and the x axis as the offset voltage.

Up till now, it is proposed that, to control the output power of high frequency power amplifier 14 (i.e. the power of transmission output signals) in polar modulation transmitting apparatus 10, correction is performed to establish a proportional relationship between the power supply voltage $V_{CC}$ and output power by adjusting the level of the baseband amplitude signal S1 and adding the offset voltage shown in FIG. 2 to the level-adjusted baseband amplitude signal in power supply voltage forming apparatus 13 (e.g. see Patent Document 1). By this means, it is possible to prevent distortion due to offset from being produced.

This configuration will be briefly explained using FIG. 3. In power supply voltage forming apparatus 13 in FIG. 3, level adjusting section 21 receives as input a baseband amplitude signal S1. Then, level adjusting section 21 adjusts the level of the baseband amplitude signal S1 according to, for example, scaling coefficients from a transmission power control section (not shown), and outputs the level-adjusted baseband amplitude signal to offset adding section 23. Offset adding section 23 forms the power supply voltage $V_{CC}$ of high frequency power amplifier 14 by adding an offset voltage generated in offset voltage generating section 22 to the level-adjusted baseband amplitude signal, and supplies the formed voltage to the power supply terminal of high frequency power amplifier 14.

Patent Document 1: U.S. Pat. No. 6,998,919, specification

DISCLOSURE OF INVENTION

Problems to be Solved by the Invention

However, as shown in FIG. 3, a method of controlling the level of the baseband amplitude signal S1 and then adding offset voltage to the level-adjusted signal, normally employs analog signal processing, and, consequently, offset voltage generating section 22 is a load seen from the path for processing the baseband amplitude signal S1. As a result, especially when the signal level after level adjustment is high, that when a high output is provided, there is a problem that distortion is likely to be produced in a transmission output signal to be outputted from high frequency power amplifier 14.

It is therefore an object of the present invention to provide a power supply voltage forming apparatus and polar modulation transmitting apparatus that can correct the offset voltage of a high frequency power amplifier without degrading the distortion characteristic of the high frequency power amplifier.

Means for Solving the Problem

The power supply voltage forming apparatus of the present invention, which forms a power supply voltage to supply to a high frequency power amplifier based on input data, employs a configuration having: a first digital-to-analog converter that performs digital-to-analog conversion of the input data; a level adjusting section that adjusts a level of the input data subjected to analog conversion, based on an output level control value for controlling an output level of the high frequency power amplifier; a second digital-to-analog converter that performs digital-to-analog conversion of offset data; an analog offset adding section that performs analog addition of the offset data subjected to analog conversion to a signal of the adjusted level; a digital offset adding section that performs digital addition of the offset data to the input data not subjected to the analog conversion; and a selecting section that comprises a first addition selecting mode for selecting performing addition in the analog offset adding section and a second addition selecting mode for selecting performing addition in the digital offset adding section, and that selects between the first addition selecting mode and the second addition selecting mode based on the output level control value.

ADVANTAGEOUS EFFECTS OF INVENTION

The present invention is designed to switch, based on an output level control value, between performing digital addition of the offset value and performing analog addition of the offset value, thereby making it possible to switch from an offset analog addition mode to an offset digital addition mode when a high output level is provided. As a result, it is possible to correct the offset voltage of a high frequency power amplifier without degrading the distortion characteristic of the high frequency power amplifier.

BRIEF DESCRIPTION OF DRAWINGS

FIG. 8 illustrates switching the addition operations in a power supply voltage forming apparatus according to Embodiment 3;

BEST MODE FOR CARRYING OUT THE INVENTION

Embodiments of the present invention will be explained below in detail with reference to the accompanying drawings.

Embodiment 1

Figure 4:
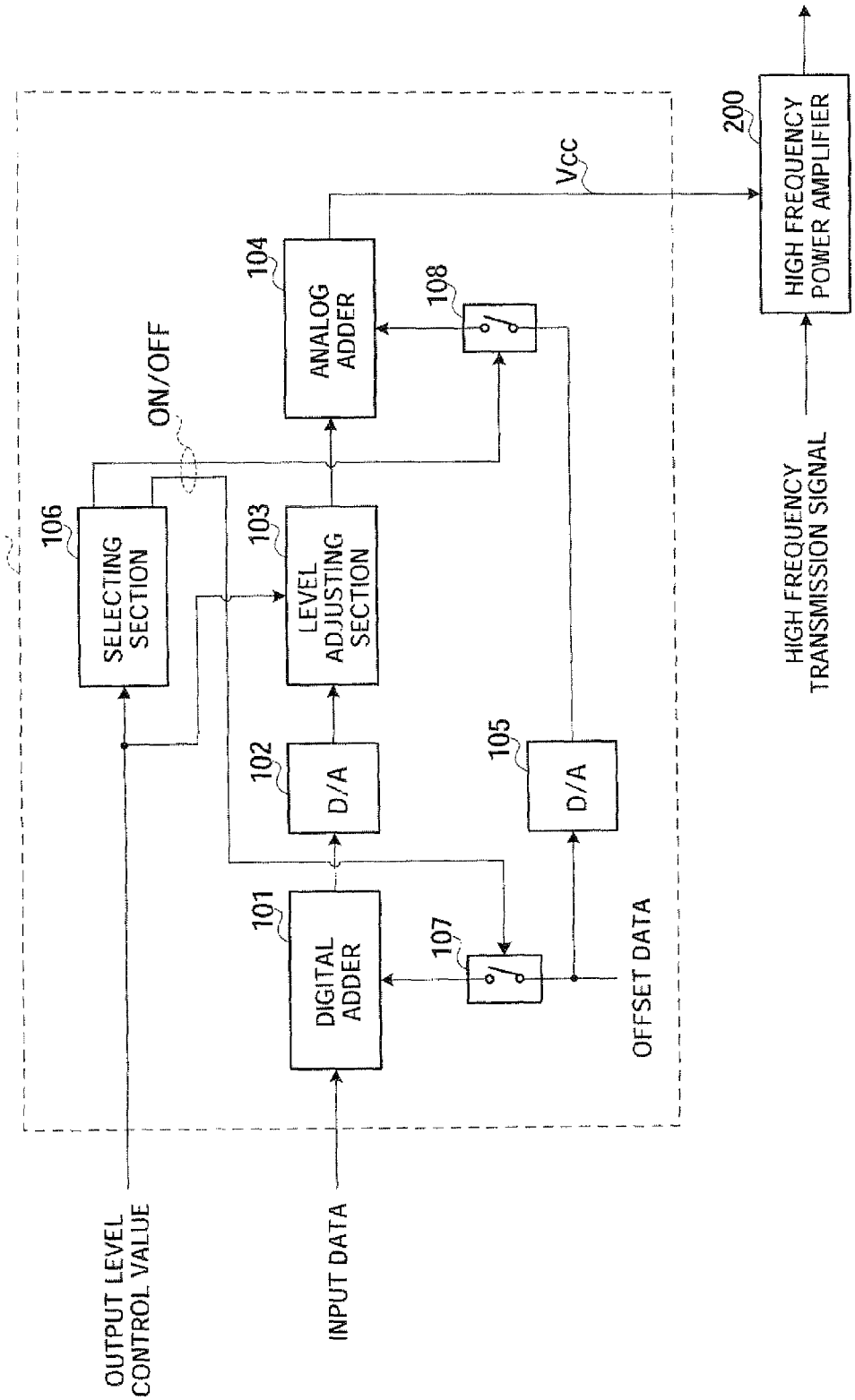
FIG. 4 is a block diagram showing the configuration of a power supply voltage forming apparatus according to Embodiment 1 of the present invention.

FIG. 4 illustrates the basic configuration of a power supply voltage forming apparatus according to an embodiment of the present invention. Power supply voltage forming apparatus 100 forms the power supply voltage $V_{CC}$ to supply to the power supply terminal of high frequency power amplifier 200. High frequency power amplifier 200 is formed with a HBT device.

In power supply voltage forming apparatus 100, input data is received as input in digital adder 101. When power supply voltage forming apparatus 100 is used in a polar modulation transmitting apparatus, this input data is equivalent to the baseband amplitude signal.

Figure 1:
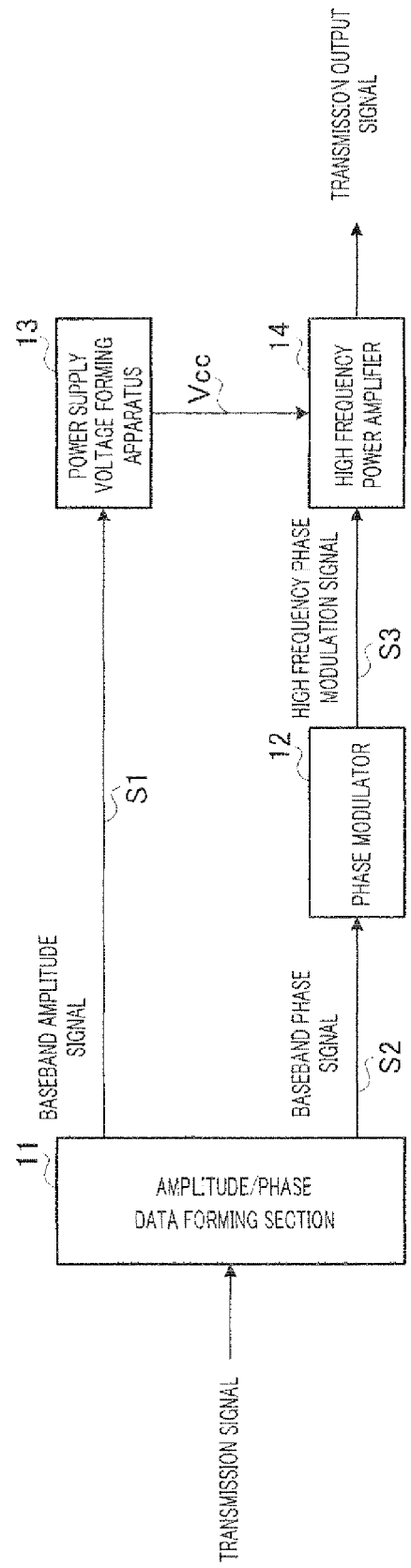
FIG. 1 is a block diagram showing the configuration of a conventional polar modulation transmitting apparatus.
Figure 2:
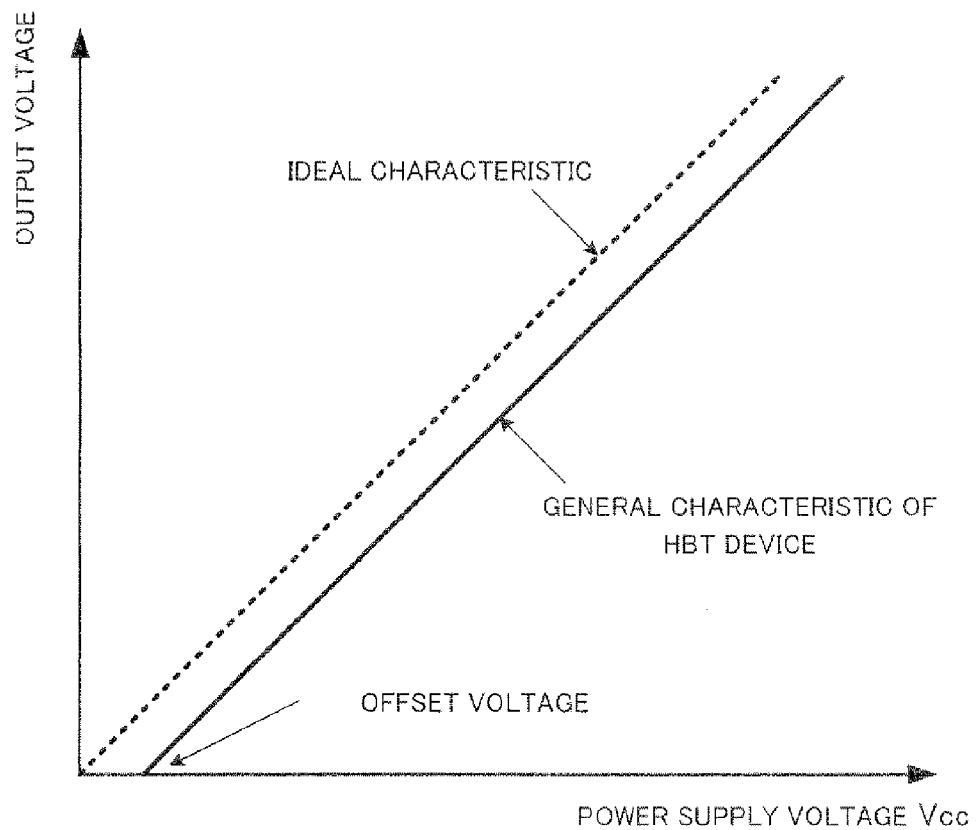
FIG. 2 illustrates a characteristic diagram showing the relationship between the power supply voltage value $V_{CC}$ and output power in the case of using a HBT device.
Figure 3:
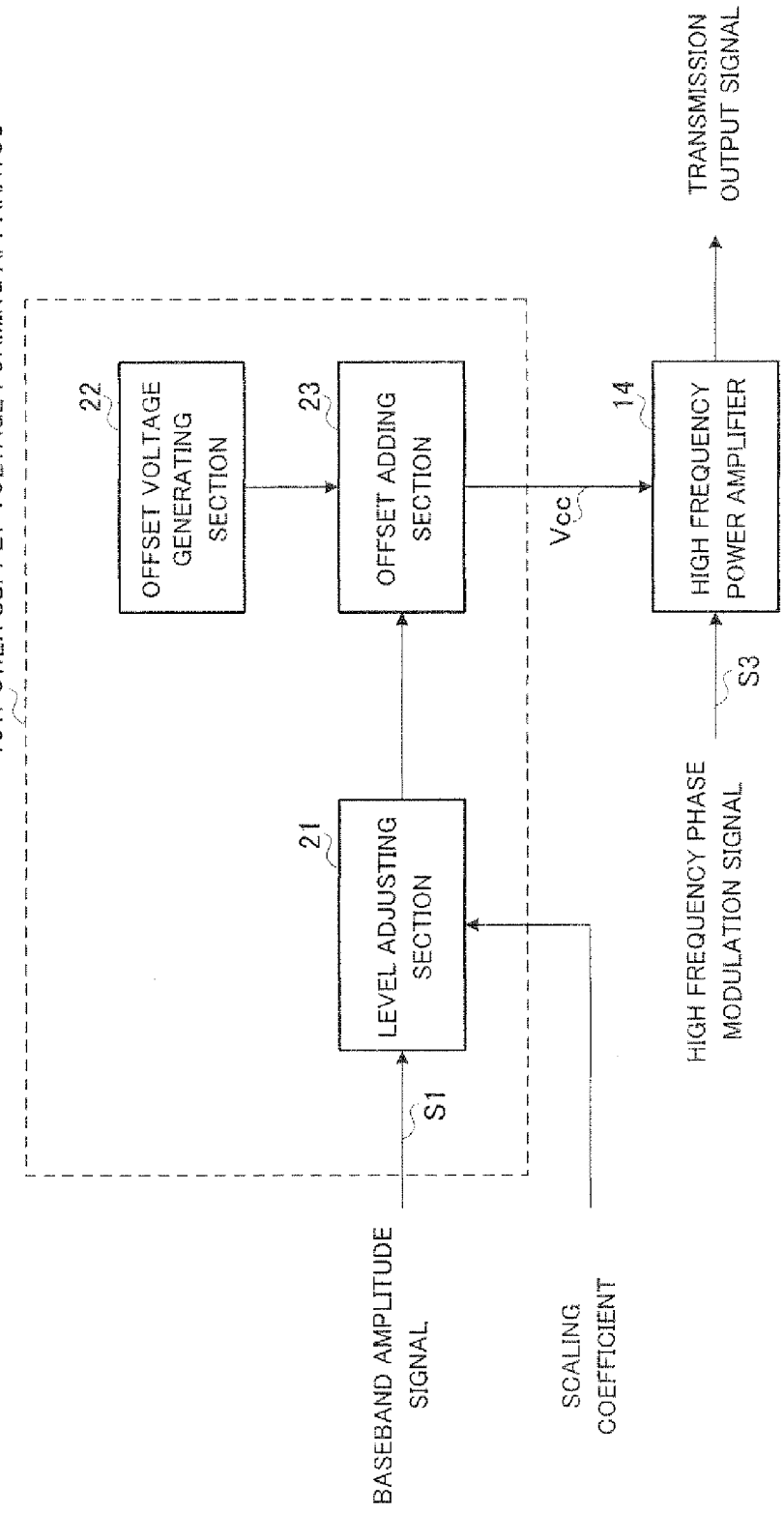
FIG. 3 is a block diagram showing a configuration example of a conventional power supply voltage forming apparatus.

Digital adder 101 adds offset data to the input data. Here, the offset data is the data corresponding to the offset voltage shown in FIG. 2, and is stored in advance in a memory (not shown) or the like. The output of digital adder 101 is outputted to level adjusting section 103 via digital/analog converter ("D/A") 102.

Level adjusting section 103 adjusts the output signal level of digital/analog converter 102 according to an output level control value for controlling the output level of high frequency power amplifier 200. Here, the output level control value is a signal formed in a transmission power control section (not shown). The signal of the level adjusted in level adjusting section 103 is outputted to analog adder 104.

Analog adder 104 receives as input offset data, via digital/analog converter ("D/A") 105, in addition to the signal from level adjusting section 103. Analog adder 104 performs analog addition of an offset voltage subjected to analog conversion to the analog signal outputted from level adjusting section 103.

In addition to such a configuration, power supply voltage forming apparatus 100 has selecting section 106 that selects between adding offset data by digital adder 101 and adding offset voltage by analog adder 104. Selecting section 106 performs the above-noted selection based on the output level control value.

To be more specific, when the output level control value is equal to or higher than a predetermined value (i.e. when a high output is provided), selecting section 106 controls switch 107 "on" to allow digital adder 101 to add the offset data, and controls switch 108 "off" not to allow analog adder 104 to add the offset voltage. Here, the case where the output level control value is equal to or higher than a predetermined value refers to cases where the output level of high frequency power amplifier 200 is high and where therefore analog addition of offset voltage in analog adder 104 is likely to cause distortion in a transmission output signal.

By contrast with this, when the output level control value is lower than a predetermined value (i.e. when a low output is provided), selecting section 106 controls switch 107 "off" not to allow digital adder 101 to add the offset data, and controls switch 108 "on" to allow analog adder 104 to add the offset voltage. Here, the case where the output level control value is lower than a predetermined value refers to cases where the output level of high frequency power amplifier 200 is low and where therefore analog addition of offset voltage in analog adder 104 gives little influence to a transmission output signal.

Thus, by performing digital addition of offset data when a high output is provided (i.e. when the output level of level adjusting section 103 is high, in other words, when the output level of high frequency power amplifier 200 is high) and by performing analog addition of offset voltage otherwise, it is possible to correct the offset in high frequency power amplifier 200 without degrading the distortion characteristic of high frequency power amplifier 200.

Here, the offset voltage generation circuit (i.e. digital/analog converter 105 in FIG. 4) is a load seen from the signal path from level adjusting section 103 to high frequency power amplifier 200 when a high output is provided, and, consequently, distortion is produced in the power supply voltage $V_{CC}$ to supply to high frequency power amplifier 200, thereby degrading the distortion characteristic of an output signal of high frequency power amplifier 200.

However, with power supply voltage forming apparatus 100 of the present embodiment, the path between analog adder 104 and digital/analog converter 105 is blocked by switch 108 when a high output is provided, so that distortion is not produced. Further, the offset is corrected by digital addition in digital adder 101, so that distortion due to the offset is not produced either.

By contrast, if digital adder 101 performs digital addition of offset data before conversion in digital/analog converter 102 upon a low output, offset data needs to be added digitally taking into account the amount of attenuation in level adjusting section 103. For example, when the signal level is attenuated by 20 dB in level adjusting section 103, digital adder 101 needs to add offset data equivalent to a voltage ten times the needed value, and therefore this is not realistic.

However, with power supply voltage forming apparatus 100 of the present embodiment, digital adder 101 does not add offset data and analog adder 104 adds an offset voltage when a low output is provided, so that it is possible to correct offset without digitally adding offset data of many digits.

As described above, the present embodiment is provided with: first digital/analog converter 102 that performs digital/analog conversion of input data; level adjusting section 103 that adjusts the level of the input data subjected to analog conversion based on an output level control value to control the output level of high frequency power amplifier 200; second digital/analog converter 105 that performs digital/analog conversion of offset data; analog adder 104 that performs analog addition of offset data subjected to analog conversion to the signal with the adjusted level; digital adder 101 that performs digital addition of the offset data and the input data not subjected to analog conversion; and selecting section 106 that selects between performing addition in analog adder 104 and performing addition in digital adder 101 based on the output level control value, when the power supply voltage is formed based on the input data and the output level control value, it is possible to form a power supply voltage $V_{cc}$ that can correct the offset in high frequency power amplifier 200 while preventing distortion due to analog addition from being produced.

Further, upon a low output in which distortion due to analog addition is actually little (i.e. when the output level control value is low), by performing analog addition of offset data and not performing digital addition of offset data, offset digital addition needs not be performed for data of many digits, so that it is possible to simplify the configuration of digital adder 101.

Embodiment 2

Figure 5:
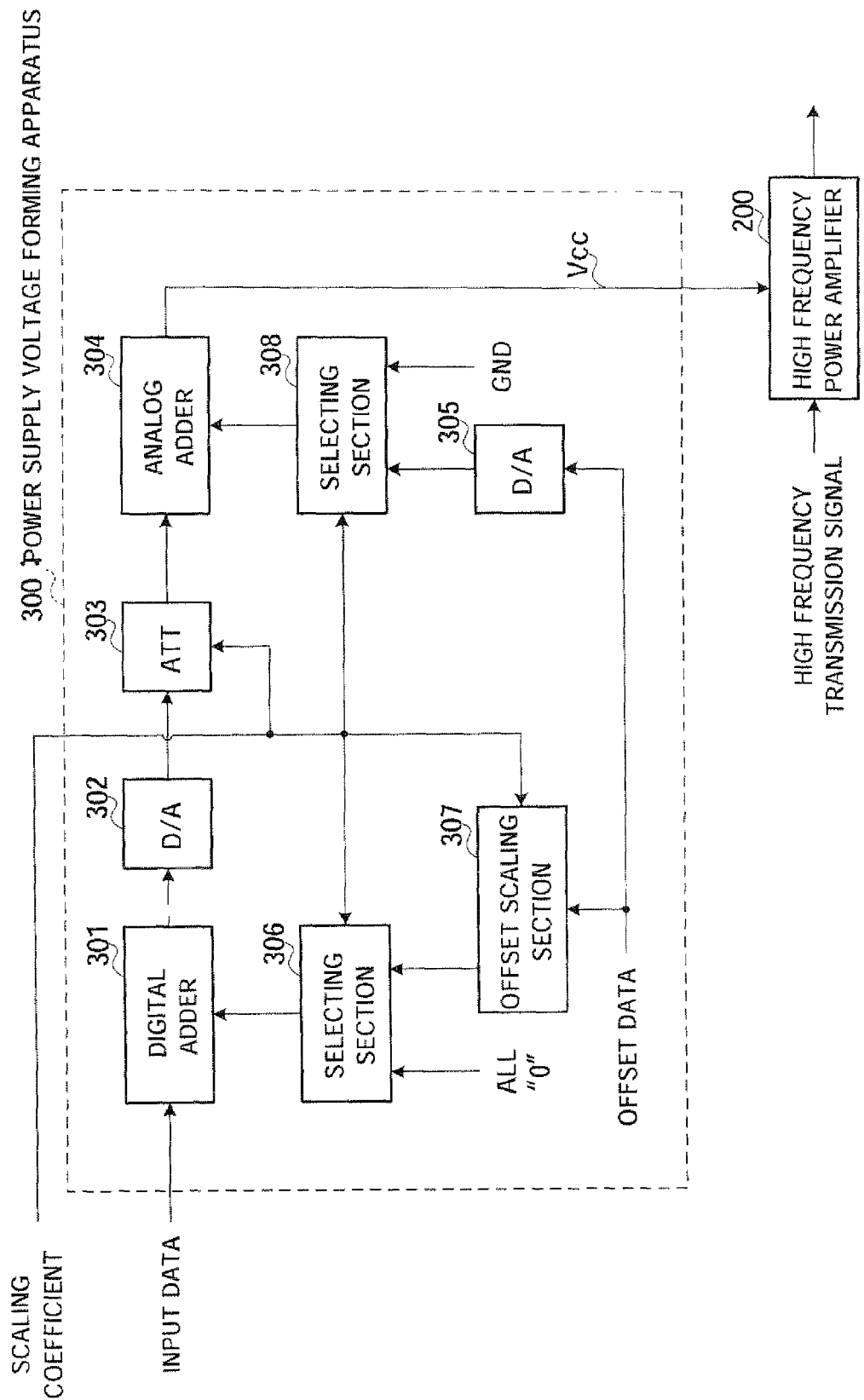
FIG. 5 is a block diagram showing the configuration of a power supply voltage forming apparatus according to Embodiment 2.

FIG. 5 illustrates the configuration of the power supply voltage forming apparatus according to Embodiment 2. Power supply voltage forming apparatus 300 of the present embodiment performs the same basic operations as power supply voltage forming apparatus 100, but takes some ingenuity in the configuration.

Digital adder 301 receives input data as input. Further, digital adder 301 selectively receives as input one of output data of offset scaling section 307 and data of all "0's" from selecting section 306. Digital adder 301 adds one of offset-scaled data and the data of all "0's" to the input data. The output of digital adder 301 is outputted to variable attenuator ("ATT") 303 via digital/analog converter ("D/A") 302.

Variable attenuator 303 is equivalent to level adjusting section 103 in FIG. 4, and attenuates the output signal of digital/analog converter 302 according to a scaling coefficient. The scaling coefficient is equivalent to the output level control value in FIG. 4, and is, for example, a signal formed in a transmission power control section. The signal of the level adjusted in variable attenuator 303 is outputted to analog adder 304.

Analog adder 304 selectively receives as input one of the offset voltage subjected to analog conversion in digital/analog (D/A) converter 305 and a voltage value of 0 [V] from selecting section 308, in addition to the signal from variable attenuator 303. By this means, analog adder 304 performs analog addition of one of the offset voltage and a voltage of 0 [V] to the signal from attenuator 303.

Here, offset scaling section 307 is designed to receive as input offset data and scaling coefficient, and, based on the scaling coefficient, multiplies the offset data by the reciprocal of the amount of level adjustment in the level adjusting section (i.e. variable attenuator 303 in the case of the present embodiment). In other words, offset scaling section 307 outputs the value dividing the offset data by the amount of attenuation in variable attenuator 303, as offset-scaled digital data. By this means, when the offset voltage after digital addition is attenuated in variable attenuator 303, it is possible to make this attenuated offset voltage value a desired offset voltage equivalent to offset data.

When the scaling coefficient is equal to or higher than a predetermined value (i.e. when a high output is provided), selecting section 306 selects the output of offset scaling section 307 and supplies this to digital adder 301. Further, when the scaling coefficient is equal to or higher than the predetermined value, selecting section 308 selects the ground voltage ("GND") and supplies this to analog adder 304. By this means, when a high output is provided, practically, the offset voltage is subjected to digital addition in digital adder 301 and is not subjected to analog addition in analog adder 304. As a result, when a high output is provided, it is possible to correct the offset voltage by digital addition without producing distortion due to analog addition.

By contrast, when the scaling coefficient is lower than a predetermined value (i.e. when a low output is provided), selecting section 306 supplies digital data of all "0's" to digital adder 301. Further, when the scaling coefficient is lower than the predetermined value, selecting section 308 selects the offset voltage outputted from digital/analog converter 305 and supplies this to analog adder 304. By this means, when a low output is provided, practically, the offset voltage is subjected to analog addition in analog adder 304 and is not subjected to digital addition in digital adder 301. As a result, it is possible to correct the offset voltage by analog addition without digitally adding offset data of many digits.

Figure 6:
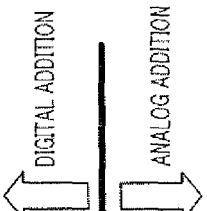
FIG. 6 illustrates switching the addition operations in a power supply voltage forming apparatus according to Embodiment 2.

The above-described switching between digital addition and analog addition will be explained using FIG. 6. FIG. 6 illustrates an example case where input data is a baseband amplitude signal (i.e. amplitude signal in the figure) in polar modulation. Further, FIG. 6 illustrates an example case where the maximum dynamic range of an amplitude signal is 1 [Vpp], the maximum offset voltage adjustment range is 0.2 [V] and the maximum dynamic range of digital analog converter 302 is 0 to 1.4 [V]. In FIG. 6, the amplitude signal range does not include the offset voltage. Further, in FIG. 6, all values are converted to analog values.

FIG. 6 illustrates how the dynamic range of each signal changes before and after scaling according to the amount of sealing in a variable attenuator, when an offset voltage of 0.2 [V] is added digitally to an amplitude signal (i.e. input data).

The limit in the case of digitally adding offset data is that the total signal range after digital addition does not exceed the maximum dynamic range of digital/analog converter 302. In this example, the total signal range after digital addition does not exceed a maximum dynamic range of 1.4 [V] of digital/analog converter 302 until the amount of scaling (i.e. setting value in ATT 303) is approximately −6 [dB], Therefore, digital addition is performed if the amount of scaling is equal to or greater than −6 [dB], and analog addition is performed if the amount of scaling is less than −6 [dB].

That is, according to the present embodiment, with the similar configuration to that of Embodiment 1, it is possible to provide the same effect as in Embodiment 1.

In addition, in cases where a threshold determination is performed for a scaling coefficient (corresponding to the output level control value in Embodiment 1) and where whether to perform digital addition of offset data or perform analog addition of offset voltage is switched based on the determination result, it is possible to suppress signal degradation in digital/analog converter 302 by setting a threshold taking into account the dynamic range of digital/analog converter 302.

Further, by providing offset scaling section 307 that scales offset data based on a scaling coefficient to be equivalent to data multiplying the offset data by the reciprocal of the amount of level adjustment in variable attenuator 303, it is possible to make the offset voltage value after passing variable attenuator 303 a desired offset voltage corresponding to the offset data.

Embodiment 3

Figure 7:
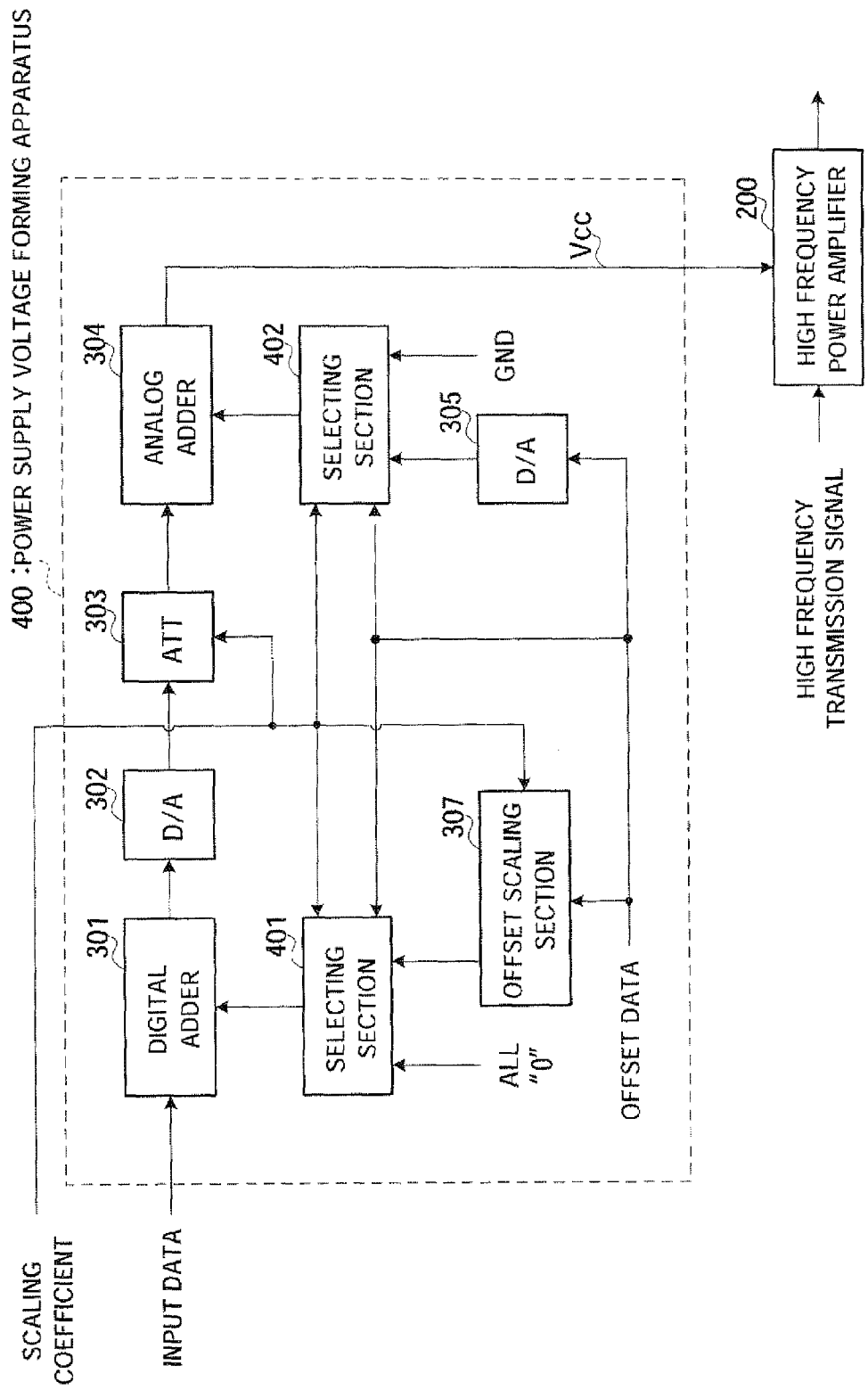
FIG. 7 is a block diagram showing the configuration of a power supply voltage forming apparatus according to Embodiment 3.

FIG. 7, which assigns the same reference numerals to the same components as in FIG. 5, illustrates the configuration of the power supply forming apparatus according to Embodiment 3.

In power supply voltage forming apparatus 400, selecting sections 401 and 402 receive as input offset data in addition to scaling coefficients. Selecting sections 401 and 402 are designed to switch between performing digital addition of the offset data and performing analog addition of offset voltage, based on both the scaling coefficients and the offset data.

To be more specific, when first offset data is received as offset data, the first scaling coefficient is set as a switching threshold. By contrast with this, when second offset data different from the first offset data is received as offset data, the second scaling coefficient different from the first scaling coefficient is set as a switching coefficient.

That is, in Embodiment 2 explained using FIG. 6, it was described for an example that the amount of scaling (−6 [dB]) associated with the maximum offset data (0.2 [V]) is used as the switching threshold. On the other hand, the present embodiment is designed to change the amount of scaling to use as a threshold according to offset data.

By this means, compared to the case of simply switching between digital addition and analog addition based on the maximum value of offset data, it is possible to flexibly widen a range to perform digital addition, according to the scale of offset.

FIG. 8 illustrates a state of switching between digital addition and analog addition in the case where the value of offset data ("THE OFFSET VOLTAGE AFTER PASSING ATT" in the figure) is 0.1 [V]. FIG. 8 illustrates operations under the same basic conditions as in FIG. 6.

As shown in FIG. 8, if the offset voltage (i.e. the value indicated by offset data) is 0.1 [V], the total signal range after digital addition does not exceed a maximum dynamic range of 1.4 [V] of digital analog converter 302 until the amount of sealing (i.e. setting value in ATT) is approximately −12 [dB]. Therefore, power supply voltage forming apparatus 400 of the present embodiment performs digital addition if the amount of scaling is equal to or greater than −12 [dB], and performs analog addition if the amount of scaling is less than −12 [dB].

When the offset voltage is set to 0.2 [V], as shown in FIG. 6, power supply voltage forming apparatus 400 performs digital addition if the amount of scaling is equal to or greater than −6 [dB], and performs analog addition if the amount of scaling is less than −6 [dB].

Thus, the present embodiment is designed to perform a threshold determination for the amount of scaling, switch between adding the offset voltage in analog adder 304 and adding offset data in digital adder 301 based on this determination result, and change the threshold based on offset data, so that it is possible to widen the range to perform digital addition to a maximum extent, in addition to the effects in Embodiment 1 and Embodiment 2.

Embodiment 4

Figure 9:
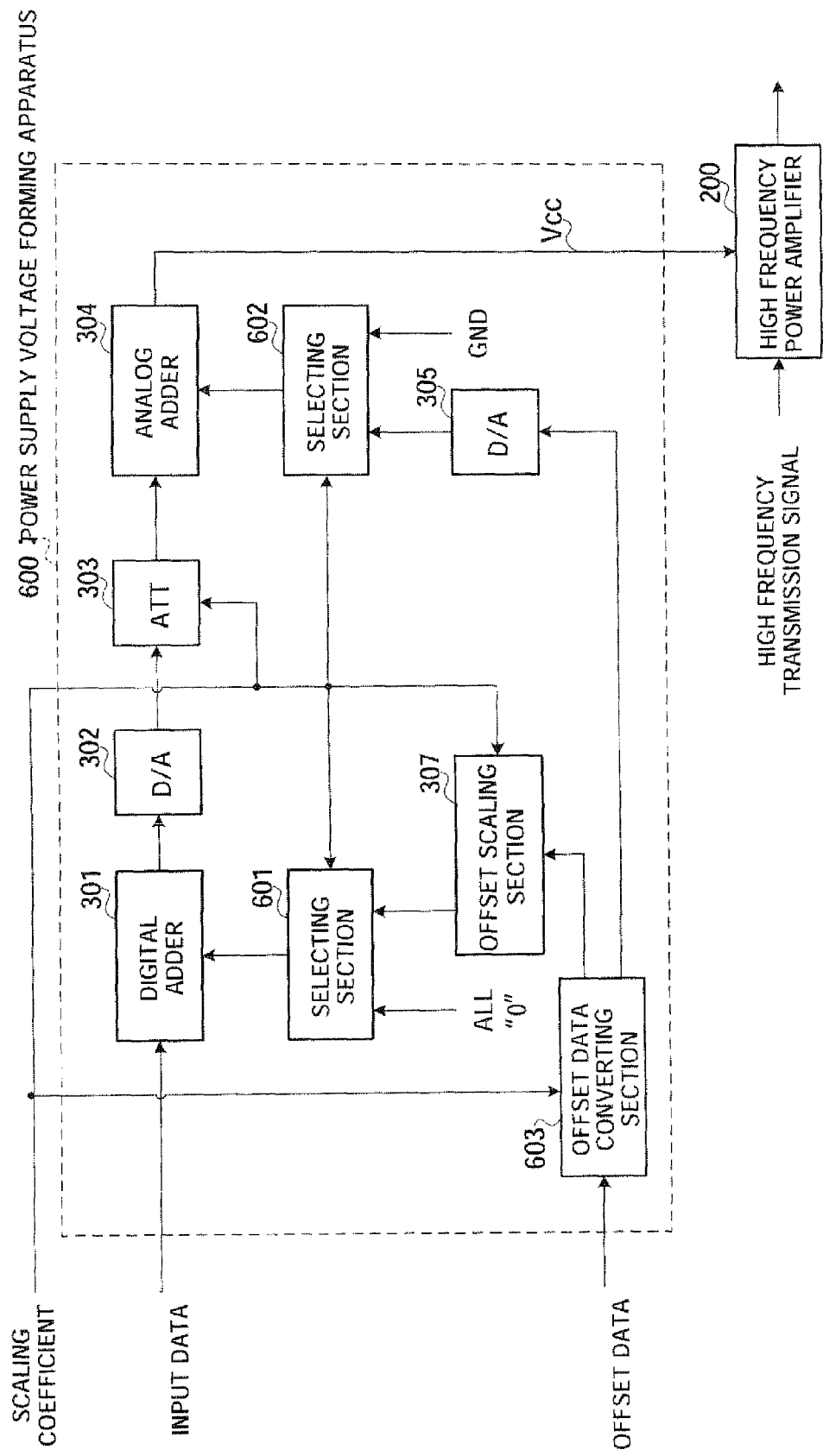
FIG. 9 is a block diagram showing the configuration of a power supply voltage forming apparatus according to Embodiment 4.

FIG. 9, which assigns the same reference numerals to the same components as in FIG. 5, illustrates the configuration of the power supply voltage according to Embodiment 4.

In power supply voltage forming apparatus 300 according to Embodiment 2 explained using FIG. 5, selecting sections 306 and 308 have the first addition selecting mode for selecting performing addition in analog adder 304 and the second addition selecting mode for selecting performing addition in digital adder 301, and select one of the first addition selecting mode and second addition selecting mode based on a scaling coefficient (i.e. output level control value).

In power supply voltage forming apparatus 600 according to the present embodiment, selecting sections 601 and 602 further have a third addition selecting mode for selecting performing addition in both analog adder 304 and digital adder 301, in addition to the above-described first and second addition selecting modes, and select one from the first to third addition selecting modes based on a scaling coefficient (i.e. output level control value).

Further, power supply voltage forming apparatus 600 according to the present embodiment has offset data converting section 603. Based on a scaling coefficient, offset data converting section 603 converts offset data into offset data for analog addition that is received as input in digital/analog converter ("D/A") 305 and offset data for digital addition that is received as input in offset scaling section 307.

When the scaling coefficient is equal to or higher than the first predetermined value (i.e. when a high output is provided), selecting section 601 selects the output of offset scaling section 307 and supplies this to digital adder 301. Further, when the scaling coefficient is equal to or higher than the first predetermined value, selecting section 602 selects the ground voltage ("GND") and supplies this to analog adder 304. By this means, when a high output is provided, practically, the offset voltage is subjected to digital addition in digital adder 301 and is not subjected to analog addition in analog adder 304. As a result, when a high output is provided, it is possible to correct offset voltage by digital addition without producing distortion due to analog addition.

When the scaling coefficient is lower than the first predetermined value and equal to or higher than a second predetermined value (i.e. when a medium output is provided), selecting section 601 selects the output of offset scaling section 307 and supplies this to digital adder 301. Further, when the scaling coefficient is lower than the first predetermined value and equal to or higher than the second predetermined value, selecting section 602 selects the offset voltage to be outputted from digital/analog converter 305 and supplies this to analog adder 304. By this means, when a medium output is provided, both digital adder 301 and analog adder 304 perform addition. That is, practically, the offset voltage is subjected to digital addition in digital adder 301 and also analog addition in analog adder 304.

When the scaling coefficient is lower than the second predetermined threshold (i.e. when a low output is provided), selecting section 601 supplies digital data of all "0's" to digital adder 301. Further, when the scaling coefficient is lower than the second predetermined threshold, selecting section 602 selects the offset voltage to be outputted from digital/ analog converter 305 and supplies this to analog adder 304. By this means, when a low output is provided, practically, the offset voltage is subjected to analog addition in analog adder 304 and is not subjected to digital addition in digital adder 301. As a result, it is possible to correct the offset voltage by analog addition without digitally adding offset data of many digits.

When the scaling coefficient is equal to or higher than the first predetermined value (i.e. when a high output is provided), offset data converting section 603 supplies offset data as is, to offset scaling section 307. Similarly, when the scaling coefficient is lower than the second predetermined value (i.e. when a low output is provided), offset data converting section 603 supplies offset data as is, to digital/analog converter 305.

On the other hand, when the scaling coefficient is lower than the first predetermined value and equal to or higher than the second predetermined value (i.e. when a medium output is provided), offset data converting section 603 converts offset data into offset data for analog addition and offset data for digital addition, and outputs the offset data for analog addition to digital/analog converter ("D/A") 305 and supplies the offset data for digital addition to offset scaling section 307.

Figure 10:
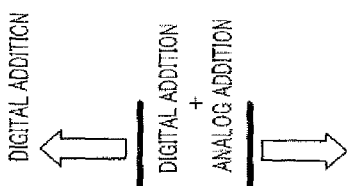
FIG. 10 illustrates switching the addition operations in a power supply voltage forming apparatus according to Embodiment 4.

The above-described switching between digital addition and analog addition will be explained in detail using FIG. 10. FIG. 10 illustrates an example case where input data is a baseband amplitude signal ("amplitude signal" in the figure) in polar modulation. Further, FIG. 10 illustrates an example case where the maximum dynamic range of an amplitude signal is 1 [Vpp], the maximum offset voltage adjustment range is 0.2 [V] and the maximum dynamic range of digital/ analog converter 302 is 0 to 1.4 [V]. In FIG. 10, the amplitude signal range does not include the offset voltage. Further, in FIG. 10, all values are converted to analog values.

FIG. 10 illustrates a case of digitally adding an offset voltage of 0.2 [V] to an amplitude signal (i.e. input data) in the range in which the amount of scaling (i.e. setting value in ATT 303) is greater than −6 [dB]. Further, FIG. 10 illustrates a case of performing digital addition of an offset voltage of 0.1 [V] and performing analog addition of an offset voltage of 0.1 [V], in a range in which the amount of scaling (i.e. setting value in ATT 303) is between −6 [dB] and −12 [dB]. Further, FIG. 10 illustrates a case of performing analog addition of an offset voltage of 0.2 [V] in the range in which the amount of scaling (i.e. setting value in ATT 303) is less than −12 [dB]. Further, FIG. 10 illustrates how the dynamic range of each signal changes before and after scaling according to the amount of scaling in ATT 303, in a case where only digital addition is performed, in a case where both the digital addition and analog addition are performed, and in a case where only the analog addition is performed.

The limit in the case of digitally adding offset data is that the total signal range after digital addition does not exceed the maximum dynamic range of digital/analog converter 302. In the example of FIG. 10, the total signal range after digital addition does not exceed a maximum dynamic range of 1.4 [V] of digital/analog converter 302, in the entire range of the amount of scaling (i.e. setting values in ATT 303).

Further, although Embodiment 2 changes the offset voltage subjected to analog addition from 0 [V] to 0.2 [V] across the scaling amount of −6 [dB], the present embodiment changes an offset voltage subjected to analog addition from 0 [V] to 0.1 [V], that is, it is understood that the change of the offset voltage is half compared to Embodiment 2.

Since a steeper voltage change obviously takes a longer response time to settle, the present embodiment can alleviate the influence of such transient response.

Although the present embodiment uses two values of −6 [dB] and −12 [dB] as thresholds for the amount of scaling for ease of explanation, it is equally possible to further increase the number of thresholds by finely changing a distribution ratio of offset voltage between digital addition and analog addition. That is, FIG. 10 illustrates a case where the offset data for digital addition and the offset data for analog addition are both set to 0.1 [V], it is not necessary to make the value of the offset data for digital addition and the value of the offset data for analog addition equal, and the distribution ratio may be changed. The essential requirement is that the sum of the offset data for digital addition and the offset data for analog addition is equal to offset data that is received as input in offset data converting section 603.

Thus, according to the present embodiment, by providing the third addition selecting mode for selecting performing addition in both analog adder 304 and digital adder 301, in addition to the first addition selecting mode for selecting performing addition in analog adder 304 and the second addition selecting mode for selecting performing addition in digital adder 301, it is possible to alleviate the influence of transient response caused by the change of the voltage subjected to analog addition upon switching the mode.

It is needless to say that the range to perform digital addition can be widened to a maximum extent by a combination of the present embodiment and Embodiment 3.

Other Embodiment

Figure 11:
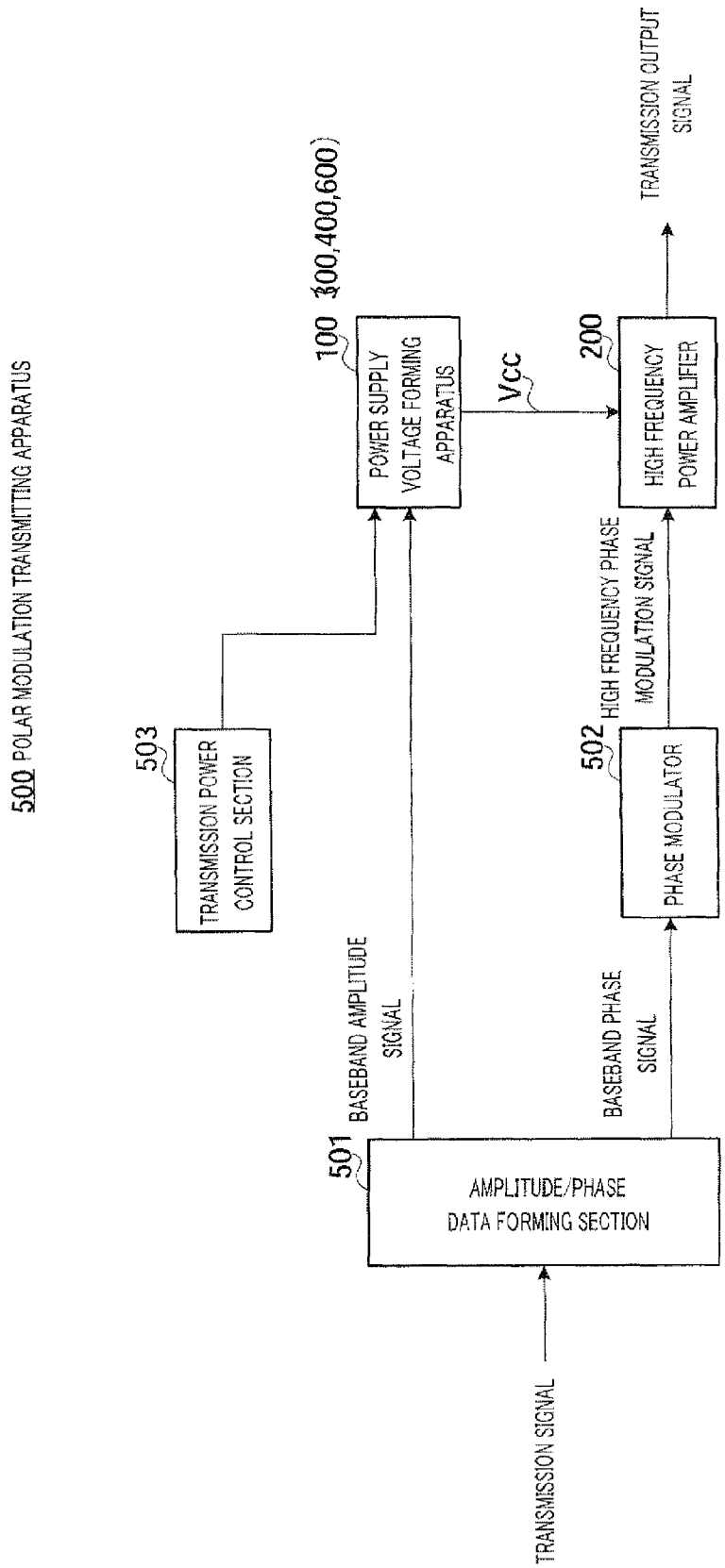
FIG. 11 is a block diagram showing the configuration of a polar modulation transmitting apparatus mounting a power supply voltage forming apparatus according to the present invention.

FIG. 11 illustrates the configuration of a polar modulation transmitting apparatus mounting power supply voltage forming apparatus 100 (300, 400 or 600) according to above-described Embodiments 1 to 4. Polar modulation transmitting apparatus 500 is provided with amplitude/phase data forming section 501, phase modulator 502, transmission power control section 503, high frequency power amplifier (also called "power amplifier") 200 and power supply voltage forming apparatus 100 (300, 400 or 600) explained in Embodiments 1 to 4.

Amplitude/phase data forming section 501 forms a baseband amplitude signal and baseband phase signal from a transmission signal that is received as input. Phase modulator 502 forms a high frequency phase modulation signal by modulating a carrier frequency signal by the baseband phase signal, and outputs the formed signal to the signal input terminal of high frequency power amplifier 200.

Power supply voltage forming apparatus 100 (300, 400 or 600) forms a power supply voltage $V_{CC}$ to supply to the power supply terminal of high frequency power amplifier 200 based on the baseband amplitude signal. Here, the baseband amplitude signal corresponds to the input data for digital adder 101 (301) in FIG. 4, FIG. 5, FIG. 7 and FIG. 9. Further, power supply voltage forming apparatus 100 (300, 400 or 600) receives as input, from transmission power control section 503, a transmission power control signal equivalent to the output level control value in FIG. 4 and the scaling coefficient in FIG. 5, FIG. 7 and FIG. 9.

With polar modulation transmitting apparatus 500 mounting power supply voltage forming apparatus 100 (300, 400 or 600) according to Embodiments 1 to 4, it is possible to correct the offset in high frequency power amplifier 200 without degrading the distortion characteristic of high frequency power amplifier 200, so that it is possible to provide transmission output signals in high quality.

Further, the present invention is not limited to the above-described embodiments, and it is possible to implement the present invention with changes in a range not departing from the subject matter of the above-described embodiments.

The disclosure of Japanese Patent Application No. 2007-022000, filed on Jan. 31, 2007, including the specification, drawings and abstract, is incorporated herein by reference in its entirety.

INDUSTRIAL APPLICABILITY

With the present invention, it is possible to correct the offset without degrading distortion characteristics even when a high frequency power amplifier is formed using a HBT device, and the present invention is widely applicable to various radio devices using a high frequency power amplifier such as mobile telephones.

The invention claimed is:

1. A power supply voltage apparatus that supplies a power supply voltage to to a high frequency power amplifier based on input data, the apparatus comprising:
a digital offset adding section that receives first offset data and input data, and performs digital addition of the first offset data to the input data to output a first signal;
a first digital-to-analog converter that receives the first signal and performs digital-to-analog conversion of the first signal;
a level adjusting section that receives the first signal subjected to analog conversion in the first digital-to-analog converter and a second signal comprising an output level control value for controlling an output level of the high frequency power amplifier, the level adjusting section performing adjustment of a level of the first signal to output an adjusted level signal, the level being adjusted based on the output level control value for controlling the output level of the high frequency power amplifier;
a second digital-to-analog converter that performs digital-to-analog conversion of the first offset data;
an analog offset adding section that receives the first offset data subjected to analog conversion in the second digital-to-analog converter, and performs analog addition of the first offset data, subjected to analog conversion, to the adjusted level signal; and
a selecting section that selects between a first addition selecting mode for performing addition in the analog offset adding section and a second addition selecting mode for performing addition in the digital offset adding section, the selection being based on the output level control value.

2. The power supply voltage apparatus according to claim 1, wherein the selecting section further selects one of the first addition selectin mode the second addition selecting mode, and a third addition selecting mode for performing addition in both the analog offset adding section and the digital offset adding section, the selection being based on the output level control value.

3. The power supply voltage apparatus according to claim 2, further comprising an offset data converting section that receives the first offset data and converts the first offset data into second offset data for the digital addition and third offset data for the analog addition, the conversion being based on the output level control value.

4. The power supply voltage apparatus according to claim 1, further comprising an offset scaling section that receives the first offset data, multiplies the first offset data by a reciprocal of an amount of level adjustment in the level adjusting section, based on the output level control value, and outputs second offset data, the second offset data being input in the digital offset adding section.

5. The power supply voltage apparatus according to claim 1, wherein the selecting section determines a threshold for the output level control value, selects one of the first addition selecting mode and the second addition selecting mode based on a threshold determination result, and changes the threshold according to the first offset data.

6. The power supply voltage apparatus according to claim 2, wherein the selecting section determines a threshold for the output level control value, selects one of the first addition selecting mode, the second addition selecting mode, and a third addition selecting mode based on a threshold determination result, and changes the threshold according to the first offset data.

7. A polar modulation transmitting apparatus comprising:
a power supply voltage apparatus according to claim 1, wherein the input data comprises a baseband amplitude signal; and
a high frequency power amplifier that receives as input the power supply voltage, supplied from the power supply voltage apparatus, and a high frequency phase modulation signal.

* * * * *

UNITED STATES PATENT AND TRADEMARK OFFICE
CERTIFICATE OF CORRECTION

| | | |
|---|---|---|
| PATENT NO. | : 7,956,667 B2 | |
| APPLICATION NO. | : 12/524671 | |
| DATED | : June 7, 2011 | |
| INVENTOR(S) | : Taichi Ikedo et al. | |

It is certified that error appears in the above-identified patent and that said Letters Patent is hereby corrected as shown below:

Claim 1, column 11, line 42, incorrectly reads:

"supply voltage to to a high frequency power amplifier based"

and should read:

"supply voltage to a high frequency power amplifier based"

Claim 2, column 12, line 17, incorrectly reads:

"addition selectin mode the second addition selecting mode,"

and should read:

"addition selecting mode, the second addition selecting mode,"

Signed and Sealed this
Thirteenth Day of March, 2012

David J. Kappos
*Director of the United States Patent and Trademark Office*